United States Patent
Rafi et al.

(10) Patent No.: US 10,840,897 B1
(45) Date of Patent: Nov. 17, 2020

(54) NOISE CANCELING TECHNIQUE FOR A SINE TO SQUARE WAVE CONVERTER

(71) Applicant: Silicon Laboratories Inc., Austin, TX (US)

(72) Inventors: Aslamali A. Rafi, Austin, TX (US); Srisai Rao Seethamraju, Nashua, NH (US); Russell Croman, Buda, TX (US)

(73) Assignee: Silicon Laboratories Inc., Austin, TX (US)

( * ) Notice: Subject to any disclaimer, the term of this patent is extended or adjusted under 35 U.S.C. 154(b) by 0 days.

(21) Appl. No.: 16/670,874

(22) Filed: Oct. 31, 2019

(51) Int. Cl.
 *H03K 5/156* (2006.01)
 *H03L 7/099* (2006.01)
 *H03L 7/089* (2006.01)
 *H03B 28/00* (2006.01)

(52) U.S. Cl.
 CPC .......... *H03K 5/1565* (2013.01); *H03B 28/00* (2013.01); *H03L 7/0896* (2013.01); *H03L 7/099* (2013.01)

(58) Field of Classification Search
 CPC combination set(s) only.
 See application file for complete search history.

(56) References Cited

U.S. PATENT DOCUMENTS

| | | | | |
|---|---|---|---|---|
| 3,508,195 A * | 4/1970 | Sellers, Jr. | .............. | G06F 13/24 714/703 |
| 4,301,466 A * | 11/1981 | Lemoine | .................. | H04N 9/64 348/539 |
| 5,467,373 A * | 11/1995 | Ketterling | ............ | H03C 3/0941 331/18 |
| 7,545,190 B2 | 6/2009 | Chiang et al. | | |
| 9,634,678 B1 * | 4/2017 | Caffee | .................... | H03L 7/0891 |
| 9,923,563 B1 * | 3/2018 | Horovitz | ................... | H03L 7/08 |
| 2002/0000800 A1 * | 1/2002 | Hill | ........................ | G01R 23/12 324/76.82 |
| 2002/0097826 A1 | 7/2002 | Iwata et al. | | |
| 2003/0112045 A1 * | 6/2003 | Atallah | ................ | H03K 5/1565 327/175 |
| 2007/0090866 A1 | 4/2007 | Park et al. | | |
| 2008/0061850 A1 | 3/2008 | Watanabe | | |
| 2010/0061499 A1 | 3/2010 | Mijuskovik | | |

(Continued)

OTHER PUBLICATIONS

Raja et al., "A 0.1-3.5-GHz Duty-Cycle Measurement and Correction Technique in 130-nm CMOS,"IEEE Transactions on VLSI Systems, May 2016, 9 pages.

(Continued)

*Primary Examiner* — Adam D Houston
(74) *Attorney, Agent, or Firm* — Zagorin Cave LLP (57) ABSTRACT

A sine to square wave converter circuit receives a sine wave signal and supplies a first square wave signal having a first frequency. A 2× clock multiplier circuit multiplies the first square wave signal and supplies a second square wave signal with a second frequency that is twice the first frequency. A first storage element that is clocked by the second square wave signal stores a delayed version of the first square wave signal and supplies an even-odd signal. A second storage element that is clocked by the second square wave signal receives the even-odd signal and supplies an odd-even signal. A duty cycle correction circuit adjusts the threshold of the sine to square wave converter based on a difference in duty pulse widths between the even-odd signal and the odd-even signal.

20 Claims, 9 Drawing Sheets

(56) References Cited

U.S. PATENT DOCUMENTS

| | | | |
|---|---|---|---|
| 2010/0164579 A1* | 7/2010 | Acatrinei | H02M 1/4208 327/172 |
| 2010/0264963 A1 | 10/2010 | Kikuchi et al. | |
| 2011/0074479 A1 | 3/2011 | Yun et al. | |
| 2011/0109354 A1 | 5/2011 | Feng et al. | |
| 2011/0204948 A1 | 8/2011 | Satoh et al. | |
| 2011/0227612 A1* | 9/2011 | Chiesa | H03B 19/14 327/119 |
| 2011/0234272 A1 | 9/2011 | Yu | |
| 2012/0153999 A1 | 6/2012 | Kim | |
| 2014/0038534 A1* | 2/2014 | Ciacci | H03F 3/24 455/108 |
| 2014/0218094 A1* | 8/2014 | Oppelt | H03K 12/00 327/299 |
| 2014/0268936 A1 | 9/2014 | Lu et al. | |
| 2018/0367614 A1* | 12/2018 | Millar | B61L 1/188 |

OTHER PUBLICATIONS

Razavi, B., "RF Microelectronics," Second Edition, Prentice Hall, 2012, pp. 664-667.

IDT, "I2C Programmable Ethernet Clock Generator," 8T49N4811 Data Sheet, Revision A, Mar. 30, 2015, pp. 1-34.

Inti, R. et al., "A 0.5-to-2.5 Gb/s Reference-Less Half-Rate Digital CDR with Unlimited Frequency Acquisition Range and Improved Input Duty-Cycle Error Tolerance," IEEE Journal of Solid-State Circuits, vol. 46, No. 12, Dec. 2011, pp. 3150-3162.

Ma, S., "Feasibility Study of Frequency Doubling Using an AN XOR-Gate Method," MSc. Thesis, Jan. 2013, pp. 1-77.

Oortgiesen, R., "Feasibility Study of Frequency Doubling Using a Dual-Edge Method," MSc. Thesis, Nov. 2010, pp. 1-56.

Razavi, B., "RF Microelectronics," Second Edition, Prentice Hall, Jun. 2015, pp. 664-667.

Wikipedia, "Phase-Locked Loop, https://en.wikipedia.org/wiki/Phase-locked_loop," downloaded Dec. 14, 2015, 17 pages.

* cited by examiner

NOISE CANCELING TECHNIQUE FOR A SINE TO SQUARE WAVE CONVERTER

BACKGROUND

Field of the Invention

This invention relates to noise canceling and more particularly to noise cancellation for a sine to square wave converter.

Description of the Related Art

Figure 1:
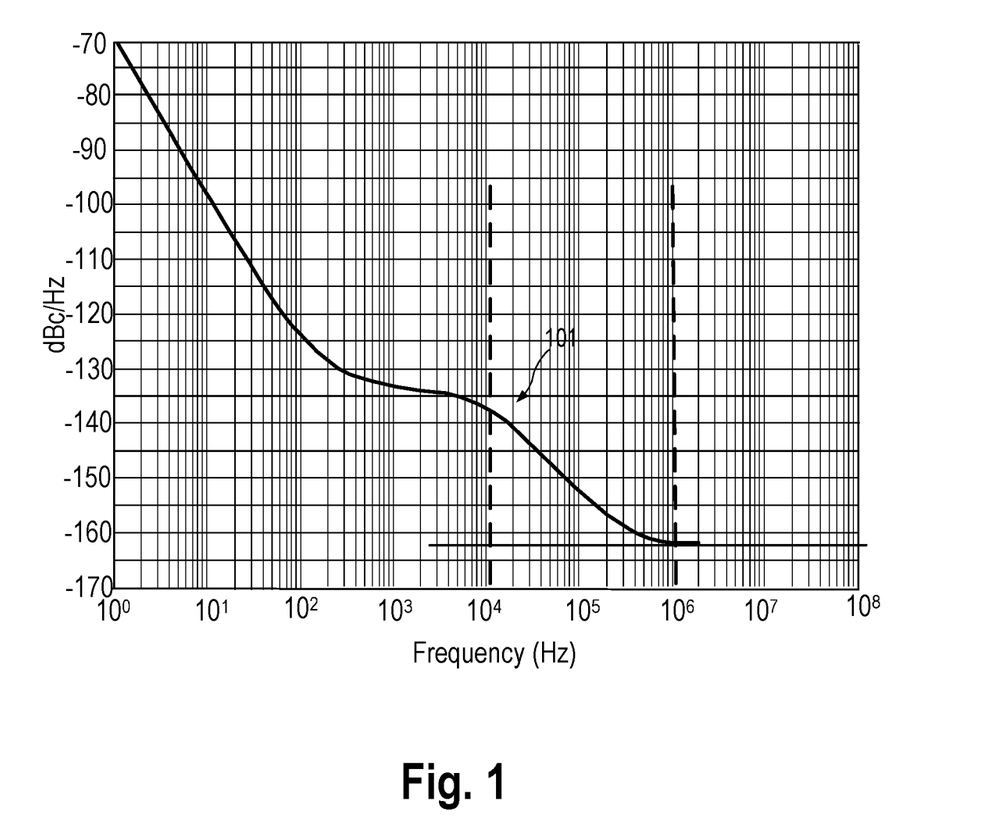
FIG. 1 shows a phase noise profile of an example frequency synthesizer and the effect of this additive noise.

Sine waves are very prevalent in electronic communication systems as oscillators naturally output sinewaves. In wireless, wired line, and optical communication links, oscillators set the time reference for the system. A frequency synthesizer following the oscillator generates the clock or a local oscillator signal of a specific and different frequency for use in the communication link. The frequency synthesizer prefers to have a rectangular wave with sharp edges as its reference input so as not to be susceptible to other noise sources from the synthesizer circuit. Hence, a sine-to-rectangular wave converter is used between the oscillator circuit and the synthesizer. However, the oscillator output is corrupted by low frequency additive noise, which might be a result of the biasing circuitry used in the oscillator or the sine-to-square wave converter. On passing through the sine-to-square wave converter, this low frequency additive noise, which can be significant, gets converted to phase noise as the edges of the rectangular wave get modulated by the additive noise. This noise also appears at the output of the frequency synthesizer and affects the phase noise performance of the clock or the local oscillator signal, ultimately affecting the performance of the data communication link. The effect of this additive noise is shown as the "hump" 101 in the phase noise profile of an example frequency synthesizer. Accordingly, better ways to address noise would be desirable to improve the performance of frequency synthesizers and ultimately to improve the performance of data communication links.

SUMMARY OF EMBODIMENTS OF THE INVENTION

Accordingly, in one embodiment, an apparatus includes a sine to square wave converter circuit coupled to receive a sine wave signal and supply a first square wave signal having a first frequency. A clock multiplier circuit is coupled to receive the first square wave signal and to supply a second square wave signal having a second frequency that is twice the first frequency. A duty cycle correction circuit is coupled to supply a voltage to an input of the sine to square wave converter to adjust a threshold of the sine to square wave converter based on a difference in pulse widths between a first signal having the first frequency and a second signal having the first frequency.

In another embodiment, a method includes converting a sine wave signal to a first square wave signal having a first frequency in a sine to square wave converter circuit. The method further includes multiplying the first square wave signal in a clock multiplier circuit and supplying a second square wave signal with a second frequency that is twice the first frequency. A first signal having the first frequency and a second signal having the first frequency are generated using the second square wave signal and a threshold of the sine to square wave converter is adjusted based on a difference in pulse widths between the first signal and the second signal.

In an embodiment a sine to square wave converter circuit is coupled to receive a sine wave signal and supply a first square wave signal having a first frequency. A clock multiplier circuit is coupled to receive the first square wave signal and to supply a second square wave signal with a second frequency that is twice the first frequency. A first storage element has an input coupled to a delayed version of the first square wave signal, the first storage element is clocked by the second square wave signal supplied by the clock multiplier circuit and supplies an even-odd signal. A second storage element has an input coupled to the even-odd signal, is clocked by the second square wave signal and supplies an odd-even signal. A duty cycle correction circuit is coupled to supply a voltage to an input of the sine to square wave converter to adjust a threshold of the sine to square wave converter based on a difference in pulse widths between the even-odd signal and the odd-even signal.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates similar or identical items.

DETAILED DESCRIPTION

Embodiments described herein reduce the low frequency additive noise caused by biasing circuitry used in the oscillator and/or the sine-to-square wave converter, which noise otherwise gets converted to phase noise as the edges of the rectangular wave get modulated by the additive noise. Embodiments described herein improve phase noise performance while consuming very small silicon area, is modular and usable with any PLL architecture (analog/digital) following the sine-to-square wave converter. It also consumes very low power.

Figure 2:
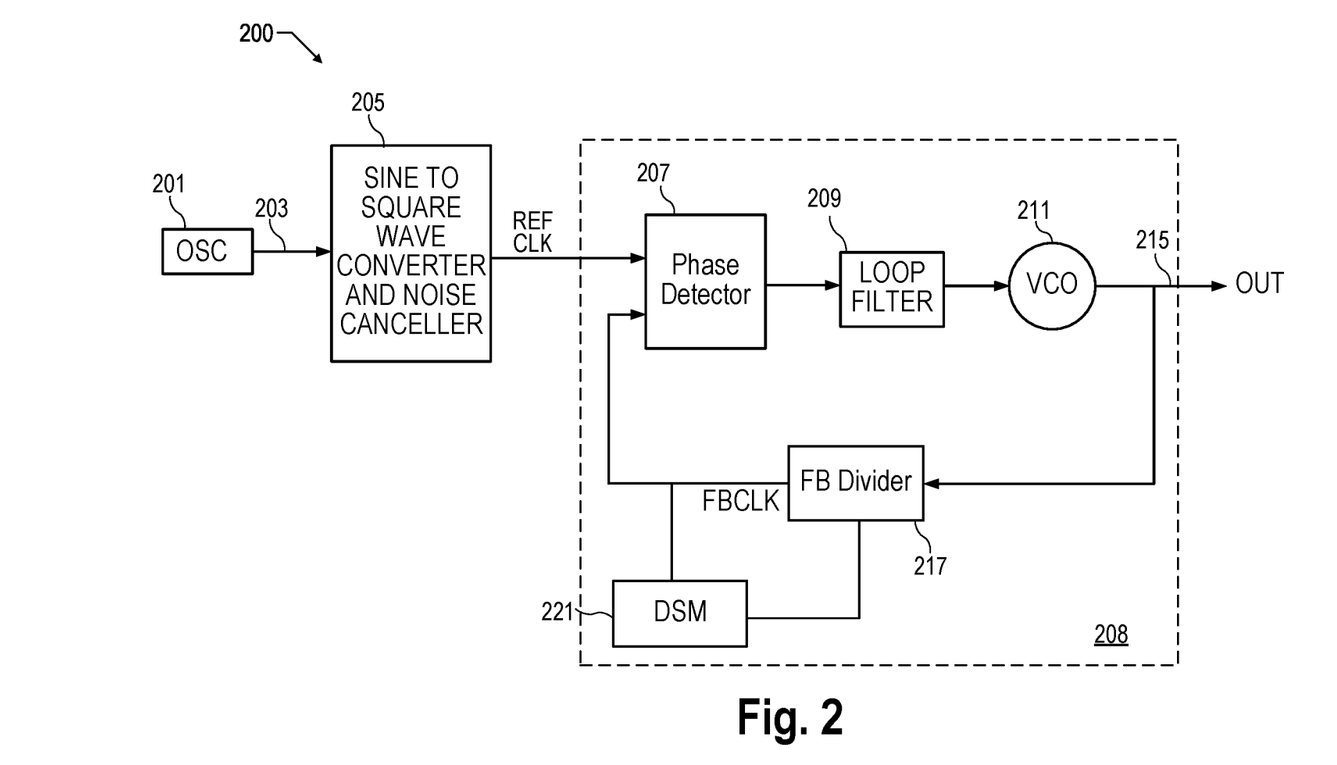
FIG. 2 illustrates a block diagram of an embodiment of a system that reduces noise.

FIG. 2 illustrates an exemplary block diagram of a system 200 that reduces noise. An oscillator 201 provides a sine wave 203 to the sine to square wave converter and noise canceller 205. The sine to square wave converter and noise canceller 205 supplies a reference clock signal with reduced noise to the phase detector 207 of the phase locked loop 208 that includes a loop filter 209, a voltage controlled oscillator 211 supplying an output signal 215. The goal is to ensure that the output signal 215 does not have phase noise caused by the additive noise from the oscillator or the sine to square wave converter. The PLL 208 also includes a feedback divider 217 and a delta sigma modulator 221 to control the divider ratio of the feedback divider. Embodiments described herein are equally applicable to other PLL architectures, for example Integer-N, in which there is no DSM modulating the divide values of the feedback divider.

Figure 3:
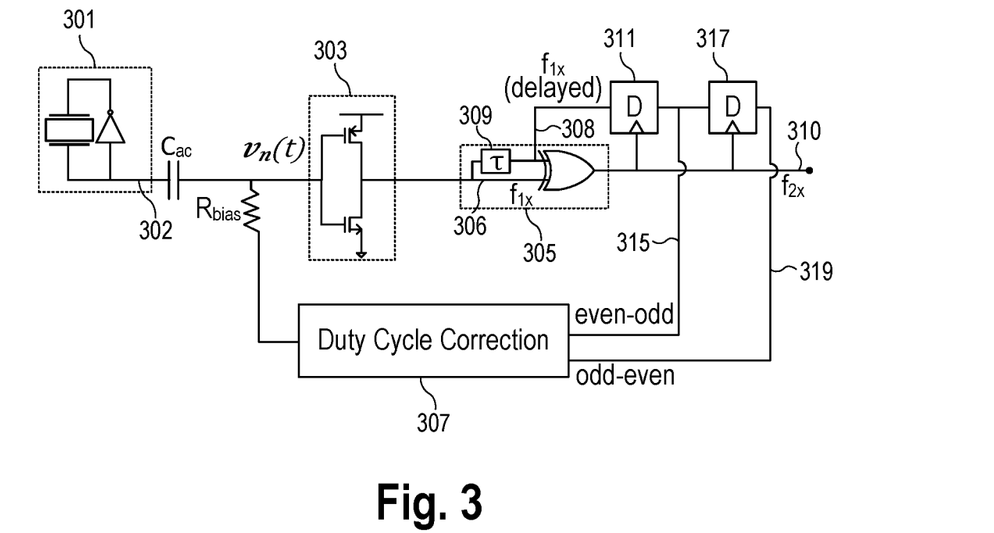
FIG. 3 illustrates additional details of a system that reduces noise that includes a sine to square wave converter followed by a 2× clock multiplier and a feedback loop providing duty cycle correction.

FIG. 3 illustrates aspects of the system in greater detail. In the embodiment of FIG. 3, the oscillator 301 is crystal oscillator and supplies a sine wave signal 302 to the sine to square wave converter circuit 303. A key idea is to follow the sine to square wave converter circuit 303 with a 2× clock multiplier 305 and then adjust the threshold of the sine-to-square wave converter through the feedback loop that includes the duty cycle correction circuit 307. The 2× clock multiplier 305 doubles the frequency of the $f_{1x}$ signal 306 supplied by the sine to square wave converter 303 and provides the $f_{2x}$ signal 310.

Figure 4A:
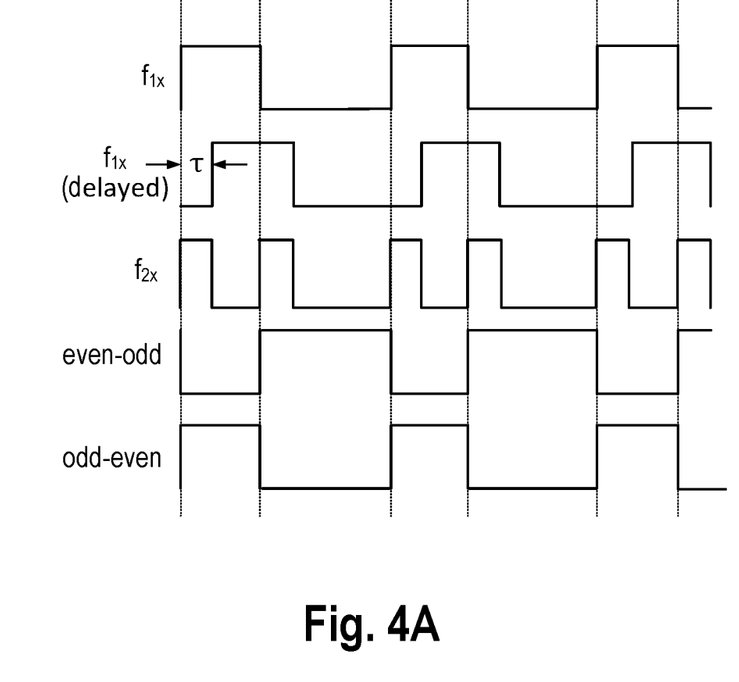
FIG. 4A shows a timing diagram of the signals generated by the circuit in FIG. 3.
Figure 4B:
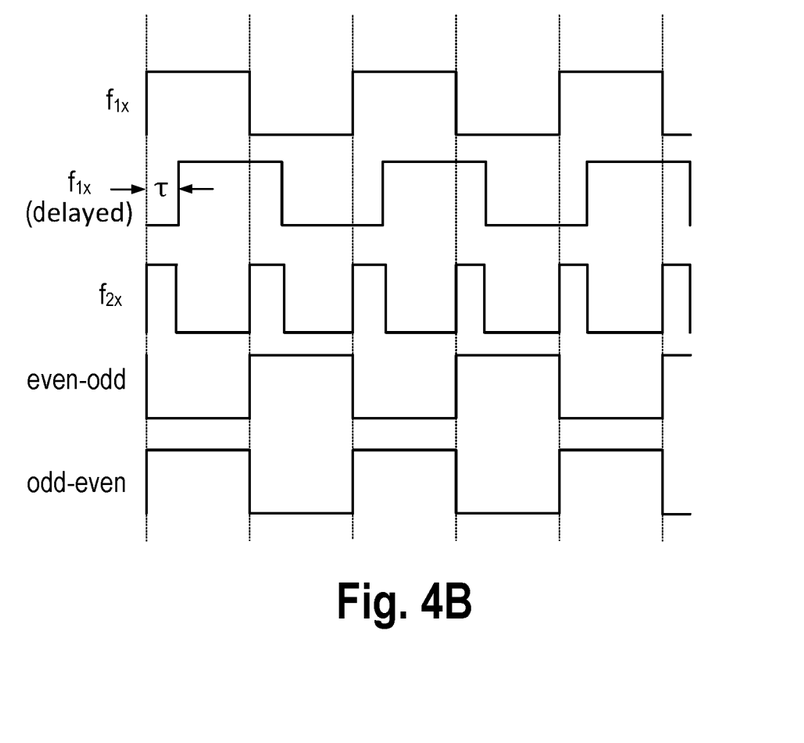
FIG. 4B shows a timing diagram of the signals generated by the circuit in FIG. 3 with the $f_{1x}$ signal with a 50% duty cycle.

FIG. 4A shows a timing diagram of the signals generated by the circuit in FIG. 3. Referring to FIGS. 3 and 4, the $f_{1x}$ signal 306 and the delayed $f_{1x}$ signal 308 delayed by a delay circuit 309 having a delay of T are supplied to the XOR gate to generate the $f_{2x}$ signal 310. The storage element (e.g., a D flip-flop) 311 receives the delayed $f_{1x}$ signal 308, is clocked by the $f_{2x}$ signal and supplies the even-odd signal 315 having the first frequency to duty cycle correction circuit 307 and to storage element (e.g., D flip-flop) 317. Storage element 317 supplies the odd-even signal 319, also having the first frequency, to duty cycle correction circuit 307. Note that the even-odd and odd-even signals have nominally equal pulse widths but of opposite polarity. The $f_{2x}$ signal 310 is supplied to the phase and frequency detector of the clock synthesizer circuit (not shown in FIG. 3) as the reference clock signal. FIG. 4B shows a timing diagram of the signals generated by the circuit in FIG. 3 with the $f_{1x}$ signal 306 having a duty cycle of 50%.

Figure 5:
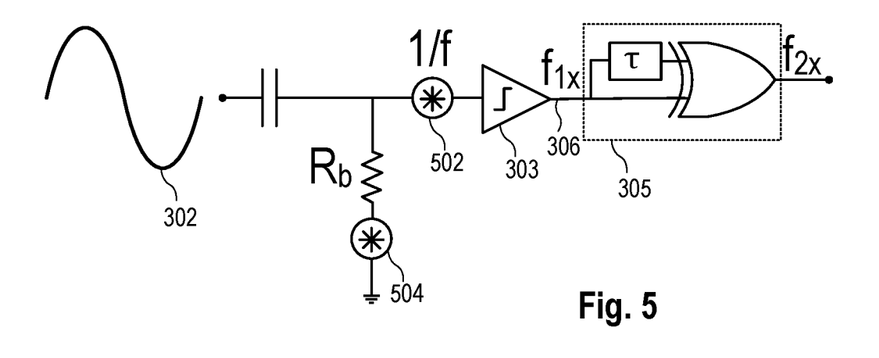
FIG. 5 illustrates noise sources in the system of FIG. 3.
Figure 6:
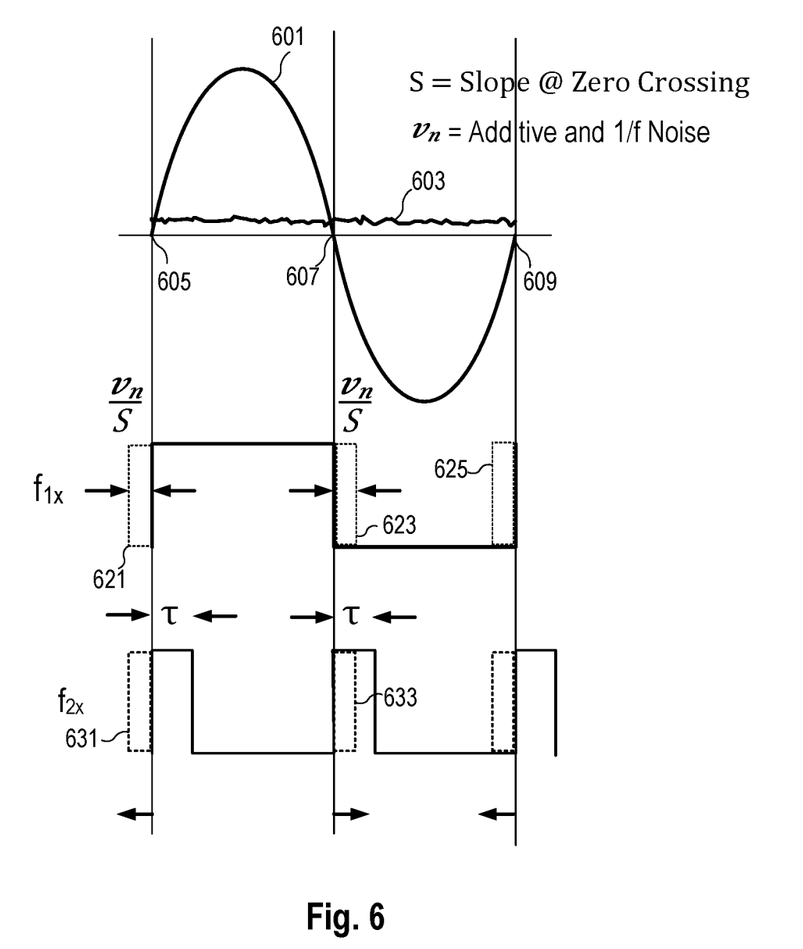
FIG. 6 illustrates how the noise manifests in the wave forms before and after the clock multiplier.

FIG. 5 shows the sine wave 302 supplied by the crystal oscillator and the 1/f noise 502 that is present in the input to the sine to square wave converter circuit 303 along with the thermal noise 504 of the DC biasing resistor that acts as additive noise. The sine to square wave converter 303 supplies the $f_{1x}$ signal 306 to the 2× multiplier 305. FIG. 6 illustrates how the noise affects the sine to square wave converter. The sine to square wave converter functions as an inverter and triggers from low to high and high to low based on the threshold settings of the sine to square wave converter. Referring to FIG. 6, the sine wave 601 along with the additive and 1/f noise 603 is supplied to the sine to square wave converter. Assume that absent noise, the sine to square wave converter ideally has a threshold set to switch at the zero crossings of the sine wave, that is, from low to high at 605, from high to low at 607, and low to high at 609. The additive and 1/f noise 603 raises the voltage of the nominal input waveform causing the sine to square wave converter to switch earlier than 605 from low to high, to switch high to low later than 607 and to switch low to high earlier than 609. The additive noise at the input of the sine to square wave converter modulates the rising and falling edges in opposite polarity. In other words, if the additive noise causes the rising edge to advance as shown at 621 and 625, it also causes the falling edge to retard as shown at 623. The amount of the rising edge advances or the falling edge retards is based on $$\frac{v_n}{S},$$

where S is the slope of the sine wave at the zero crossing and $v_n$ is the magnitude of the additive and 1/f noise. In contrast, use of the 2× multiplier following the sine to square wave converter causes adjacent edges of the 2× multiplier output ($f_{2x}$) to move in opposite directions and by the same amount as shown at 631 and 633. The phase detector of the frequency synthesizer following the 2× multiplier, sees an equal and opposite time error every other edge and rejects this additive noise.

Figure 7:
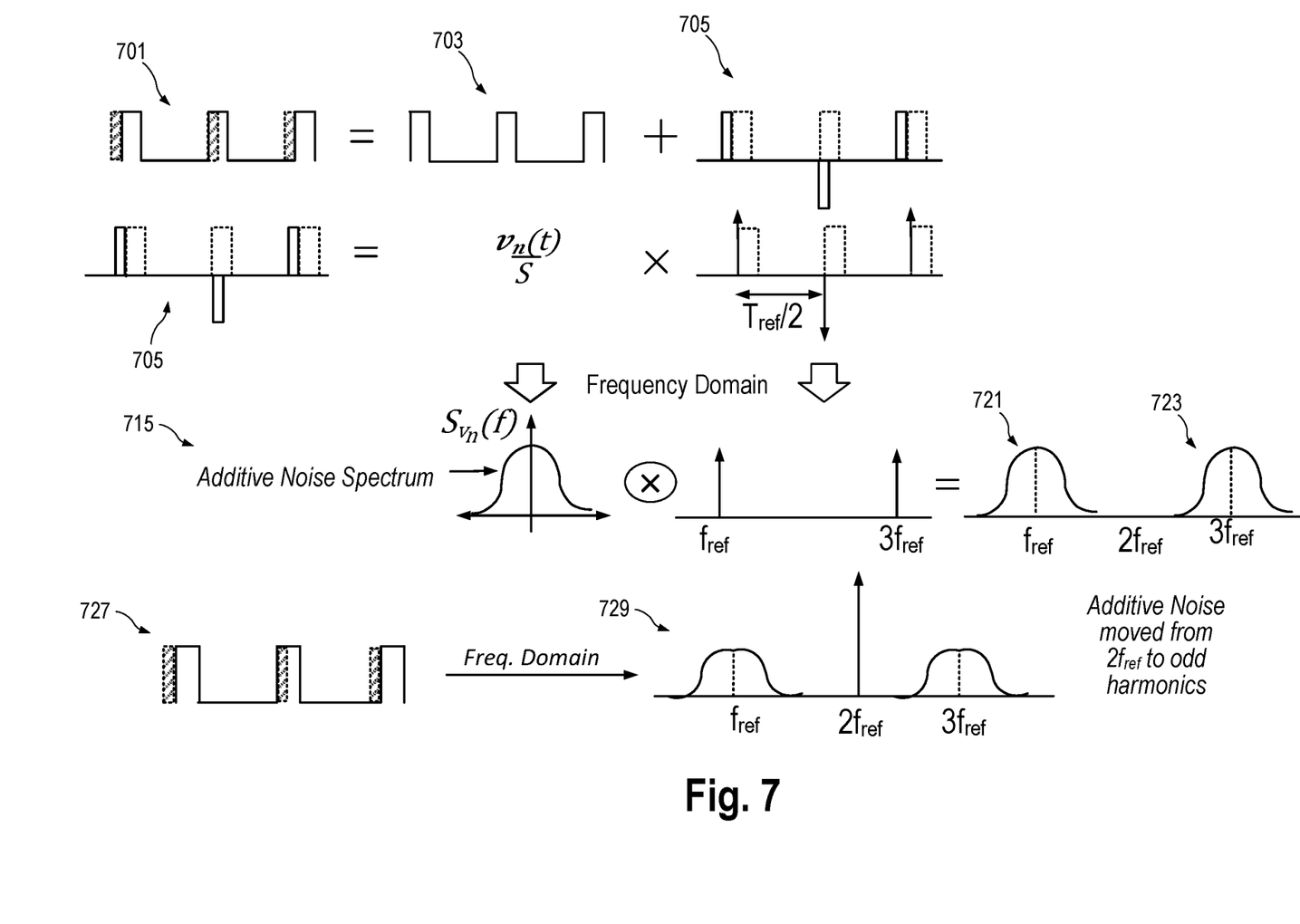
FIG. 7 illustrates how the noise is shaped by the 2× multiplier.

FIG. 7 illustrates where the noise goes as a result of the use of the 2× multiplier. At 701, the $f_{2x}$ waveform 701 is shown generated by adding the sine wave without noise 703 to the noise component 705. The noise component 705 is $$\frac{v_n}{S}$$

at the frequency $$\frac{T_{ref}}{2},$$

where $T_{ref}$ is the period of the sine wave. The frequency domain is shown at 715, which shows the noise component at $f_{ref}$ 721 and at $3f_{ref}$ 723 but absent at $2f_{ref}$ where $f_{ref}$ is $f_{1x}$. Thus, as shown in the time domain at 727 and the frequency domain at 729, the 2× multiply moves the additive noise from $2f_{ref}$ to odd harmonics.

However, due to the asymmetry of devices in the sine-to-square wave generator, the separation between the odd and even edges could be different from the separation between the even and odd edges. That might result in a large component of 1× frequency in the spectrum of the 2× output also limiting the performance of the frequency synthesizer. The feedback loop serves as a fundamental (1×) suppression circuit and adjusts the threshold of the sine-to-square converter so that the separation between the odd-even edges is the same as the separation between the even-odd edges of the 2× output.

Since the noise at the threshold input of the sine-to-square converter "only" appears around even harmonics and DC to first order, any noise contributed by the feedback loop itself gets rejected as well. That enables the design of a wider bandwidth feedback loop. Since a wider bandwidth loop naturally implies smaller time constants, this leads to a compact implementation as smaller resistors and smaller capacitors are used. Furthermore, the current consumption and silicon area is further reduced as large noisy resistors with smaller capacitors are used. (since the noise from this circuit is rejected.)

Figure 8:
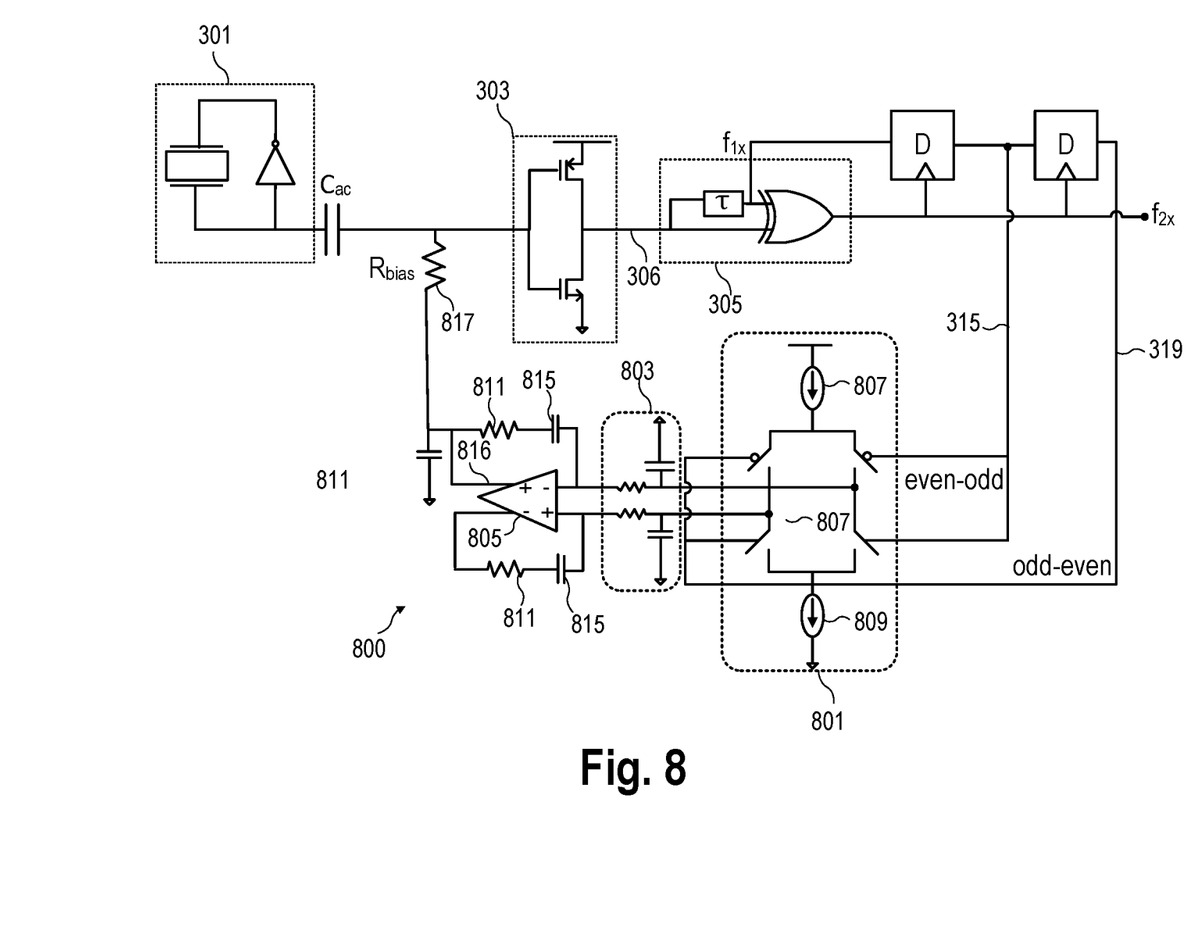
FIG. 8 illustrates a differential embodiment of the duty cycle adjustment circuit.
Figure 9A:
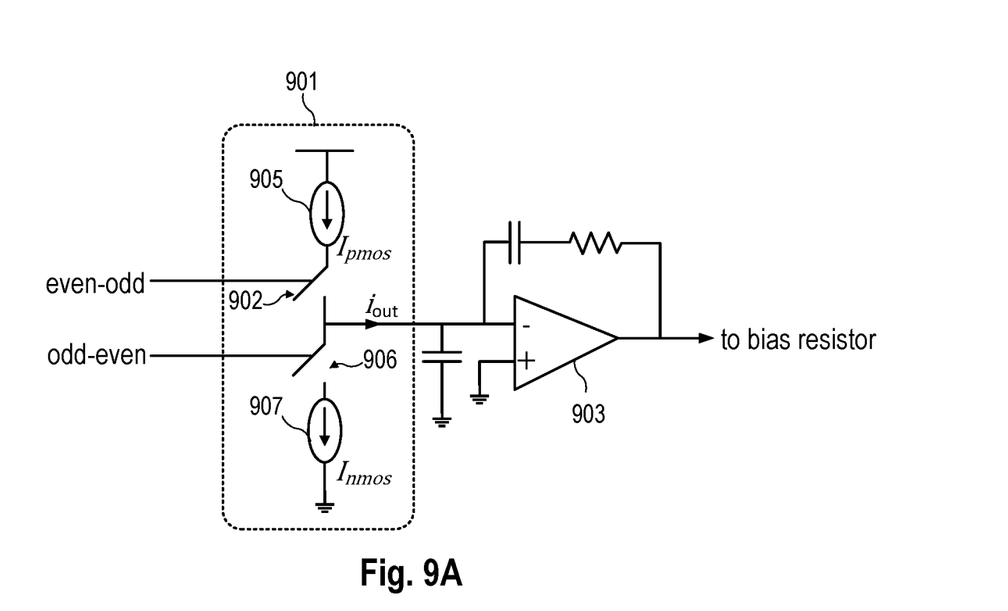
FIG. 9A illustrates a single-ended embodiment of the duty cycle adjustment circuit.

FIG. 8 illustrates an embodiment of a circuit implementation 800 of the duty cycle correction circuit 307 that corrects the $f_{1x}$ signal 306 to a 50% duty cycle. The duty cycle correction circuit 800 includes a differential charge pump 801, a filter 803, and an operational amplifier 805. The differential charge pump 801 receives the even-odd signal 315 and the odd-even signal 319 from the 2× multiplier. In comparison to a single ended charge pump (see FIG. 9), the differential charge pump is not sensitive to device mismatches in the current sources 807 and 809. The output differential current is only a function of the pulse-width difference of the even-odd and odd-even signals. Note that any pulse-width difference is due to the pulse widths of opposite polarities of the even-odd and odd-even signals being different. With the $f_{1x}$ signal 306 (see FIG. 4B) corrected by duty cycle correction circuit 800 to a 50% duty cycle, the even-odd and odd-even signals also have a 50% duty cycle and any change in duty cycle caused by noise is reflected in a change in duty cycle (and therefore pulse widths) of the even-odd and odd-even signals. Filter 803 filters the differential current and the filtered current is input to the operational amplifier 805. The operational amplifier 805 has series resistors 811 and series capacitors 815 in feedback. The series capacitors 815 acts as the integrating capacitors for the loop, while the resistors 811 sets the zero to cancel out any pole in the input network. The output 816 of the operational amplifier is supplied through the bias resistor 817 to the input of the sine to square wave converter 303 to adjust the threshold of the sine to square wave converter based on the difference in the pulse widths (of opposite polarity) of the even-odd and odd-even signals.

Referring again to FIG. 4 and FIG. 8, if the even-odd signal is low, the current source 807 supplies current to the negative input of op-amp 805 for the duration of the low pulse width and at the same time, if the odd-even signal is high, the same magnitude of current of opposite polarity is supplied by current source 809 to the positive input of op-amp 805. That assumes the high pulse width of the odd-even signal equals the low pulse width of the even-odd signal. As can be seen in FIG. 4, the even-odd and odd-even signals are nominally of equal pulse widths but of opposite polarities. Similarly, when the even-odd signal is high and the odd-even signal is low, equal and opposite currents are supplied to the amplifier inputs assuming the pulse widths of opposite polarities are equal. If the pulse widths of opposite polarities of the even-odd and odd-even signals are not equal, the current sources 807 and 809 do not provide equal magnitudes of current. That difference in currents is then integrated by the op-amp circuit and reflected in the bias voltage supplied to the input of the sine to square wave converter circuit 303 by op-amp 805 through the bias resistor 817 to adjust the threshold at which the circuit switches from high to low and low to high.

Figure 9B:
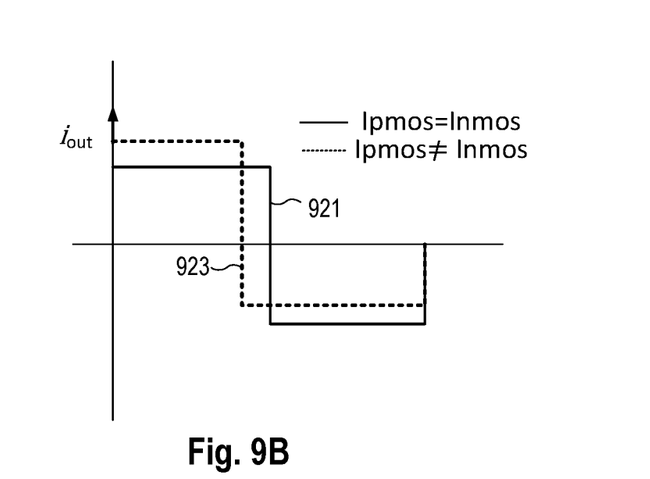
FIG. 9B illustrates the effect of mismatch in the current sources in the single-ended embodiment.

FIG. 9A shows an embodiment that uses a single ended charge pump 901 and operational amplifier 903. When the even-odd signal is high, switch 902 closes and the current from PMOS current source 905 flows to the operational amplifier 903 and when the odd-even signal is high, switch 906 closes and the current from the NMOS current source 907 flows to the operational amplifier 903. Since the "high" pulse widths of the even-odd signals and the odd-even signals are unequal when the duty cycle of the $f_{1x}$ signal 306 (see FIG. 3) is not 50%, the difference gets integrated in the operational amplifier and the duty cycle gets corrected to 50%. The embodiment in FIG. 9A is sensitive to device mismatches in the current sources 905 and 907. As shown in FIG. 9B, the current supplied by the charge pump is 921 if the PMOS current (Ipmos) from the current source 905 (implemented with one or more PMOS transistors) and the NMOS current (Inmos) from current source 907 (implemented with one or more NMOS transistors) are equal. FIG. 9B illustrates at 923 how mismatch can effect the current $i_{out}$ supplied to the operational amplifier when Ipmos is not equal to Inmos. If Ipmos is not equal to Inmos, then that in itself can cause an error in the final corrected duty cycle. That makes it necessary to have calibration of Ipmos and Inmos, for the circuit to correct the duty cycle to exactly 50%.

Figure 10:
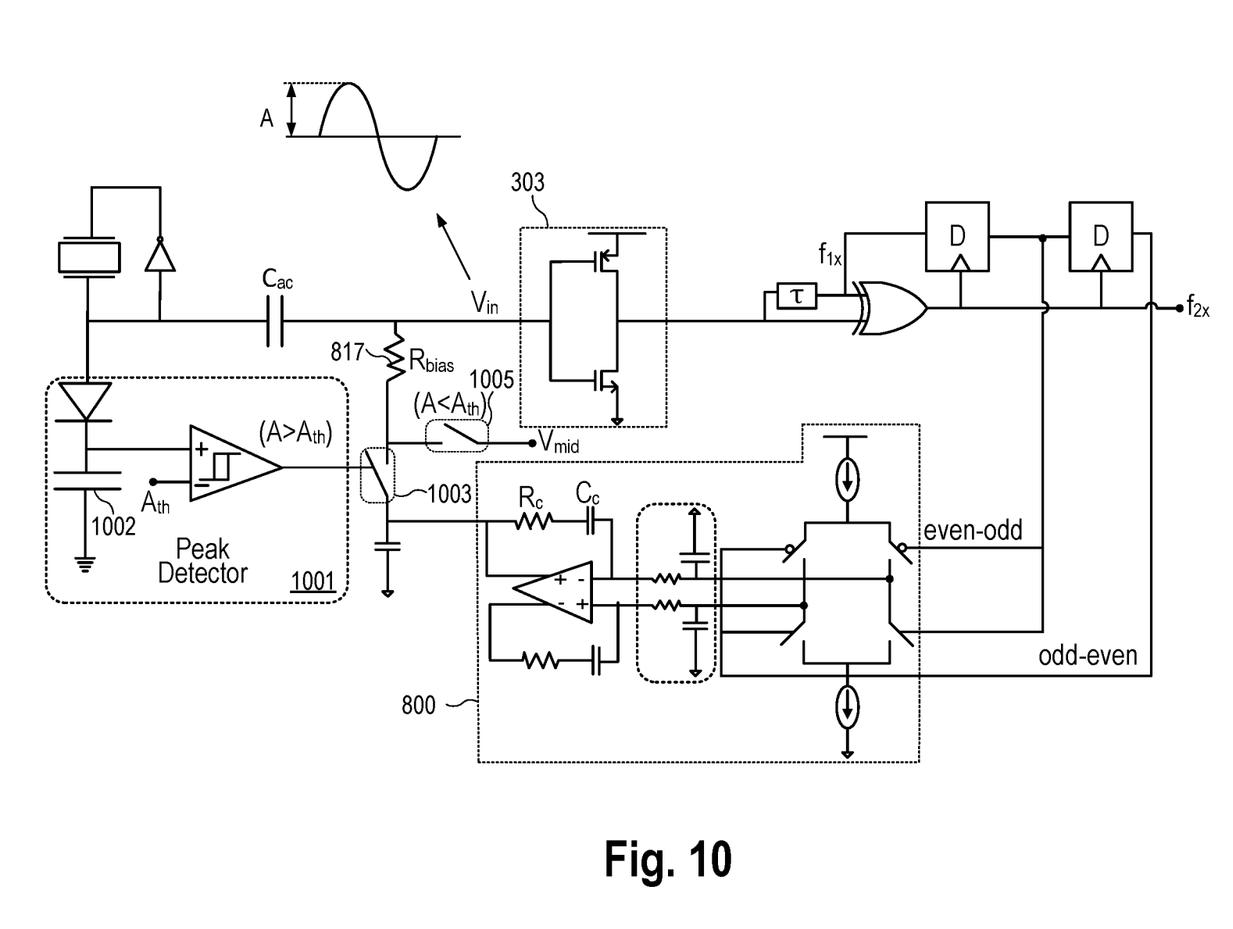
FIG. 10 illustrates a startup circuit used to keep the duty-cycle correction circuit loop open until the peak amplitude of the input sine wave signal reaches a threshold voltage value.

Loop gain is a function of amplitude A of the input signal Vin to the sine to square wave converter. Accordingly, before the input signal is of sufficient amplitude the feedback circuit will not work correctly. Accordingly, the embodiment illustrated in FIG. 10 utilizes a startup circuit to keep feedback loop open (keep the duty cycle correction circuit 307 (FIG. 3) disconnected) until the amplitude of the input signal is above a threshold voltage. The start up circuit includes a peak detector circuit 1001 that compares the peak amplitude of the sine wave to determine when the peak amplitude A>Ath, where Ath is the threshold voltage above which the loop will operate correctly. The capacitor 1002 stores the peak amplitude detected and compares that value to the peak amplitude threshold $A_{th}$. Once the peak amplitude A>$A_{th}$, the switch 1003 closes causing the duty cycle correction circuit 800 to be coupled to the input of the sine to square wave converter circuit 303 and the feedback loop to therefore be closed. That allows the feedback loop to correct the duty cycle based on the difference in pulse widths of the even-odd and odd-even pulses once the peak amplitude of the input sine wave is high enough. In addition, during startup, while the peak amplitude A<$A_{th}$, a fixed voltage $V_{mid}$ is supplied through switch 1005 to adjust the threshold of the sine to square wave converter circuit 303. The voltage $V_{mid}$ causes the sine to square wave converter to switch, e.g., at nominal zero crossings of the input sine wave.

Thus, various aspects have been described related to canceling noise in a sine to square wave converter. The description of the invention set forth herein is illustrative, and is not intended to limit the scope of the invention as set forth in the following claims. Other variations and modifications of the embodiments disclosed herein, may be made based on the description set forth herein, without departing from the scope of the invention as set forth in the following claims.

What is claimed is:

1. An apparatus comprising:
   a sine to square wave converter circuit coupled to receive a sine wave signal and supply a first square wave signal having a first frequency;
   a clock multiplier circuit coupled to receive the first square wave signal and to supply a second square wave signal having a second frequency;
   a duty cycle correction circuit coupled to the sine to square wave converter circuit to adjust a threshold of the sine to square wave converter circuit based on a difference in pulse widths between a first signal having the first frequency and a second signal having the first frequency;
   a first storage element having an input coupled to the first square wave signal, the first storage element clocked by the second square wave signal supplied by the clock multiplier circuit, the first storage element supplying an even-odd signal as the first signal; and
   a second storage element having an input coupled to the even-odd signal, the second storage element clocked by the second square wave signal and the second storage element supplying an odd-even signal as the second signal.

2. The apparatus as recited in claim 1, wherein the first storage element is coupled to the first square wave signal through a delay circuit.

3. The apparatus as recited in claim 1, wherein the duty cycle correction circuit comprises:
a charge pump responsive to supply a current reflecting the difference in pulse widths between the odd-even signal and even-odd signal; and
an operational amplifier coupled between the charge pump and an input to the sine to square wave converter circuit.

4. The apparatus as recited in claim 3, wherein the charge pump is a differential charge pump.

5. The apparatus as recited in claim 4, further comprising:
a first resistor and a first capacitor coupled in series between a first input of the operational amplifier and a first output of the operational amplifier; and
a second resistor and a second capacitor coupled in series between a second input of the operational amplifier and a second output of the operational amplifier.

6. The apparatus as recited in claim 3, further comprising:
a bias resistor coupled between an output of the operational amplifier and the input to the sine to square wave converter circuit.

7. An apparatus comprising:
a sine to square wave converter circuit coupled to receive a sine wave signal and supply a first square wave signal having a first frequency;
a clock multiplier circuit coupled to receive the first square wave signal and to supply a second square wave signal having a second frequency that is twice the first frequency;
a duty cycle correction circuit coupled to supply a voltage to an input of the sine to square wave converter circuit to adjust a threshold of the sine to square wave converter circuit based on a difference in pulse widths between a first signal having the first frequency and a second signal having the first frequency; and
a startup circuit configured to cause the duty cycle correction circuit to adjust the threshold of the sine to square wave converter circuit only after a peak amplitude of the sine wave signal is above a threshold voltage.

8. The apparatus as recited in claim 7, wherein the startup circuit further comprises:
a peak detector circuit to compare the peak amplitude of the sine wave signal to the threshold voltage and to supply a peak detect signal indicative thereof; and
a first switch to couple an output of the duty cycle correction circuit to the sine to square wave converter circuit responsive to the peak detect signal indicating the peak amplitude of the sine wave signal is above the threshold voltage and to decouple the output of the duty cycle correction circuit from the sine to square wave converter circuit responsive to the peak detect signal indicating the peak amplitude of the sine wave signal is not above the threshold voltage.

9. The apparatus as recited in claim 8, wherein the startup circuit further comprises:
a second switch to couple a fixed voltage to the sine to square wave converter circuit responsive to the peak detect signal indicating the peak amplitude of the sine wave signal is not above the threshold voltage and to decouple the fixed voltage from the sine to square wave converter circuit responsive to the peak detect signal indicating the peak amplitude of the sine wave signal is above the threshold voltage.

10. The apparatus as recited in claim 1, further comprising:
a phase-locked loop coupled to receive the second square wave signal as a reference signal.

11. The apparatus as recited in claim 1, further comprising:
a crystal oscillator coupled to supply the sine wave signal to the sine to square wave converter circuit.

12. A method as comprising:
converting a sine wave signal to a first square wave signal having a first frequency in a sine to square wave converter circuit;
multiplying the first square wave signal in a clock multiplier circuit and supplying a second square wave signal having a second frequency that is twice the first frequency;
generating a first signal with the first frequency and a second signal with the first frequency;
adjusting a threshold of the sine to square wave converter circuit based on a difference in pulse widths between the first signal and the second signal;
supplying a delayed version of the first square wave signal to a first storage element;
clocking the first storage element with the second square wave signal and supplying an even-odd signal from the first storage element as the first signal; and
supplying the even-odd signal to a second storage element; and
clocking the second storage element with the second square wave signal and supplying an odd-even signal from the second storage element as the second signal.

13. The method as recited in claim 12, further comprising:
generating a current reflecting a difference in pulse widths between opposite polarities of the odd-even signal and even-odd signal;
supplying an operational amplifier having an integrating capacitor with the current; and
adjusting a threshold of the sine to square wave converter circuit based on an output of the operational amplifier.

14. The method as recited in claim 13, further comprising:
preventing the adjusting of the threshold of the sine to square wave converter circuit based on the difference in duty cycle between the even-odd signal and the odd-even signal until after a peak amplitude of the sine wave signal is above a threshold voltage.

15. The method as recited in claim 14, further comprising:
comparing the peak amplitude of the sine wave signal to the threshold voltage and supplying a peak detect signal indicative thereof;
coupling the output of the operational amplifier to the sine to square wave converter circuit through a first switch responsive to the peak detect signal indicating the peak amplitude of the sine wave signal is above the threshold voltage; and
keeping the output of the operational amplifier from being coupled to the sine to square wave converter circuit through the first switch responsive to the peak detect signal indicating the peak amplitude of the sine wave signal is not above the threshold voltage.

16. The method as recited in claim 15, further comprising:
coupling a fixed voltage to the sine to square wave converter circuit through a second switch responsive to the peak detect signal indicating the peak amplitude of the sine wave signal is not above the threshold voltage; and preventing the fixed voltage from being coupled to the sine to square wave converter circuit through the second switch responsive to the peak detect signal indicating the peak amplitude of the sine wave signal is above the threshold voltage.

17. The method as recited in claim 12, further comprising:
generating the sine wave signal in a crystal oscillator;
supplying the sine wave signal to the sine to square wave converter circuit; and
supplying the second square wave signal as a reference signal to a phase-locked loop.

18. An apparatus comprising:
a sine to square wave converter circuit coupled to receive a sine wave signal and supply a first square wave signal having a first frequency;
a clock multiplier circuit coupled to receive the first square wave signal and to supply a second square wave signal having a second frequency that is twice the first frequency;
a first storage element having an input coupled to a delayed version of the first square wave signal, the first storage element clocked by the second square wave signal supplied by the clock multiplier circuit, and the first storage element supplying an even-odd signal;
a second storage element having an input coupled to the even-odd signal, the second storage element clocked by the second square wave signal and the second storage element supplying an odd-even signal; and
a duty cycle correction circuit coupled to supply a voltage to an input of the sine to square wave converter circuit to adjust a conversion threshold of the sine to square wave converter circuit based on a difference in pulse widths between the even-odd signal and the odd-even signal.

19. The apparatus as recited in claim 1 wherein the second frequency is twice the first frequency.

20. The apparatus as recited in claim 1 wherein the duty cycle correction circuit is coupled to supply a voltage to an input of the sine to square wave converter circuit to adjust the threshold of the sine to square wave converter circuit.

* * * * *

UNITED STATES PATENT AND TRADEMARK OFFICE
CERTIFICATE OF CORRECTION

PATENT NO. : 10,840,897 B1
APPLICATION NO. : 16/670874
DATED : November 17, 2020
INVENTOR(S) : Aslamali A. Rafi, Srisai Rao Seethamraju and Russell Croman Page 1 of 1

It is certified that error appears in the above-identified patent and that said Letters Patent is hereby corrected as shown below:

In the Claims

In Column 8, Line 12, please remove "as".

Signed and Sealed this
Thirteenth Day of April, 2021

Drew Hirshfeld
*Performing the Functions and Duties of the*
*Under Secretary of Commerce for Intellectual Property and*
*Director of the United States Patent and Trademark Office*